United States Patent
Huang

(10) Patent No.: US 6,750,535 B2
(45) Date of Patent: Jun. 15, 2004

(54) PACKAGE FOR ENCLOSING A LASER DIODE MODULE

(75) Inventor: Nan Tsung Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/173,887

(22) Filed: Jun. 18, 2002

(65) Prior Publication Data

US 2003/0197254 A1 Oct. 23, 2003

(30) Foreign Application Priority Data

Apr. 18, 2002 (TW) ...................................... 91205219 U

(51) Int. Cl.⁷ .............................................. H01L 23/02
(52) U.S. Cl. ....................................... 257/678; 257/692
(58) Field of Search ................................ 257/678, 692, 257/697; 372/50, 43

(56) References Cited

U.S. PATENT DOCUMENTS 6,587,491 B1 * 7/2003 Yamamoto .................... 372/43

* cited by examiner

*Primary Examiner*—Roy Potter
(74) *Attorney, Agent, or Firm*—Wei Te Chung

(57) ABSTRACT

A laser diode (LD) module includes a base (20), a four contacts (21), (22), (23) and (24) and package sealing material (25). The base is made of a metal material has three through holes (203), and defines a channel (204) in a bottom side thereof and in communication with the through holes. The four contacts, one is soldered to the base, and the others three inserted through the three through holes. The insulative package sealing material is plastic inserted molded into the channel and connecting through holes to fix the three contacts in the base while preventing electrical connection between the base and the contacts.

18 Claims, 5 Drawing Sheets

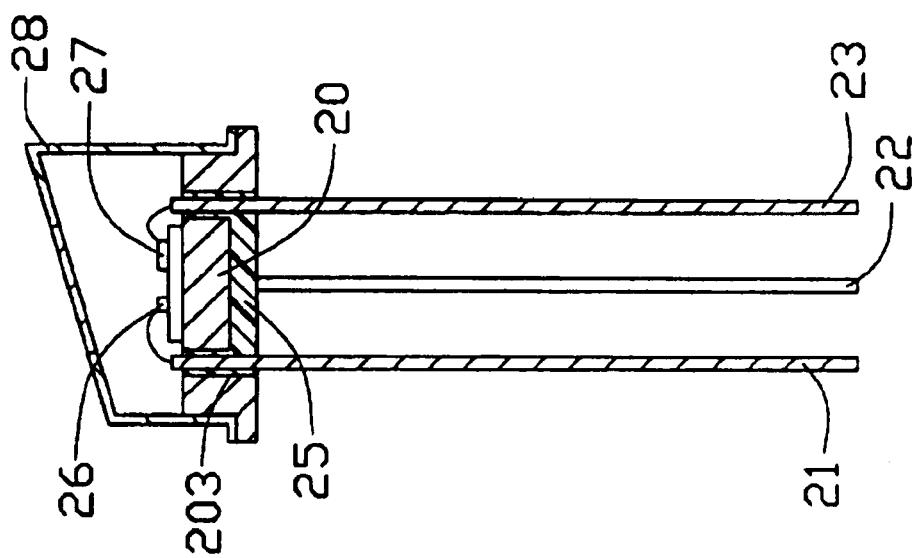
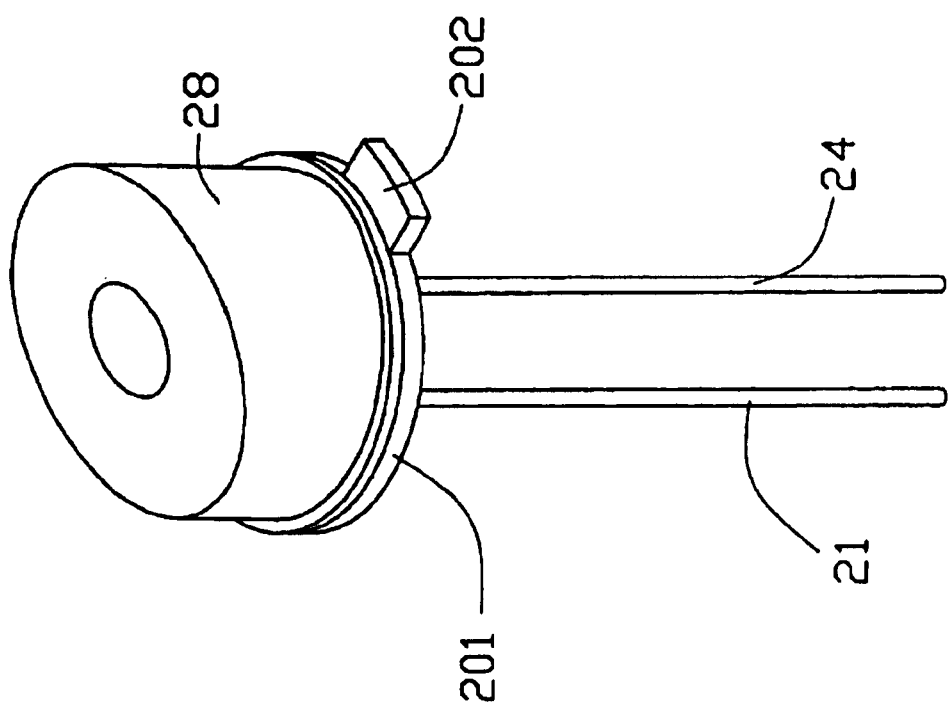
FIG. 3B
FIG. 3A

PACKAGE FOR ENCLOSING A LASER DIODE MODULE

BACKGROUND OF THE INVENTION

1. Field of the Invention

The present invention generally relates to laser diode module (LD) and, more particularly to a package for enclosing an LD module.

2. Description of the Related Art

An LD module is used in optical telecommunications and includes an LD light source incorporating an LD chip, wherein the LD light source optically coupled to an optical fiber. The LD light source normally must be protected by a horsing and the LD chip is normally electrical connected to other electrical components such as a printed circuit board (PCB).

Referring to FIGS. 5 through 7B, are prior art. LD module includes a base 10, a laser diode 16, a photo diode 17, a housing 18 and a set of electrical terminals 11, 12, 13 and 14. The base 10 is made of a metal material, and has a cylindrical shape. Three through holes 103 are defined through the base 10. Three of the terminals 11, 12, 13 pass through the through holes 103. The terminals 11, 12, 13 are used to make electrical connections between the laser diode 16, the photo diode 17 and a PCB (not shown). One terminal 14 is soldered to the bottom of the base 10 and the PCB. A gap 15 is formed between each terminals 11, 12, 13 and the corresponding through hole 103, which is caulked with glass powder, and which becomes solid after baking at a high temperature.

The above described LD module has a very good seal between the baked glass power caulking and the terminals, but production of the module has some difficulties. First, glass powder is not easily positioned in the gaps without the help of special tools. Second, since the metal terminals and base are easily oxidized at high temperatures, the baking operation is generally done in a helium atmosphere below a pressure of $1 \times 10^{-8}$ Pascals. This environment is troublesome to achieve. Third, the melting point of the glass powder can be as high as 800 degrees, heating and cooling in a short time affects the stability of the solidifying glass powder. Therefore the process receivers a rather long time, generally from 8 to 10 hours, which causes problems of long production time and high cost.

SUMMARY OF THE INVENTION

Therefore, an object of the present invention is to provide a laser diode module having an improved structure to overcome the problems mentioned above.

An LD module in accordance with a preferred embodiment of the present invention, comprises a base, a laser diode, a photo diode, a housing and four contacts, wherein the contacts are fixed in the housing by plastic insert molding. The base is made of a metal material and has three through holes. A channel is defined on a bottom surface of the base and in communication with the through holes. Of the four contacts, one is soldered to the base and the others respectively pass through the three through holes and are plastic insert molded into the through holes such that they remain electrically isolated from the base. A dielectric package sealing material is used in the insert molding and fills the channel and through holes, isolating the contacts from the base.

Other objects, advantages and novel features of the present invention will be drawn from the following detailed description of a preferred embodiment of the present invention with attached drawings, in which:

BRIEF DESCRIPTION OF THE DRAWINGS

FIG. 3A is a perspective view of a laser module of the present invention;

FIG. 3B is a cross-sectional view of a laser diode module of the present invention;

DETAILED DESCRIPTION OF THE INVENTION

Figure 1:
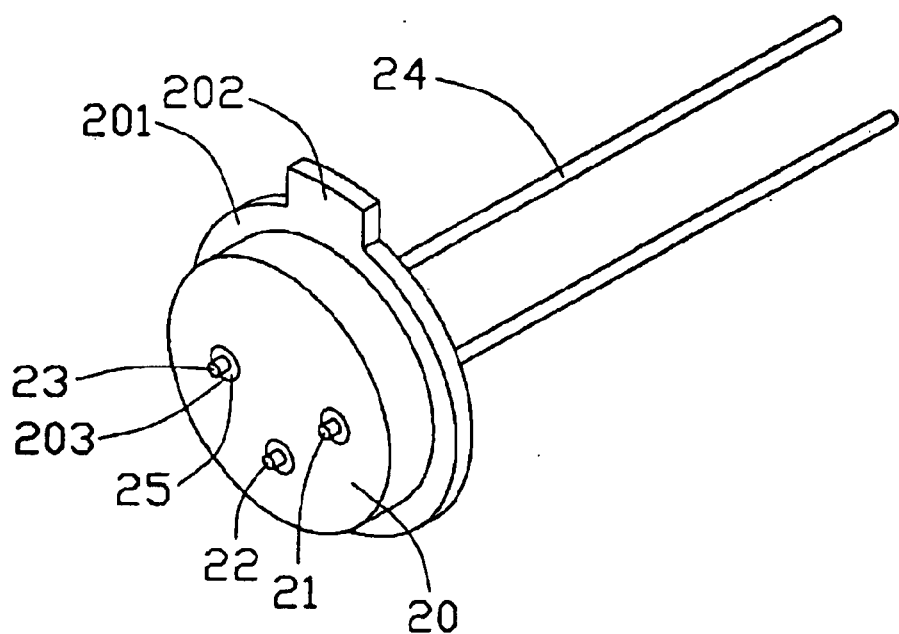
FIG. 1 is a perspective view of a base, contacts, and package sealing material of an LD module according to the present invention.

As shown in FIGS. 1–4, a laser diode (LD) module of the present invention comprises a base 20, a laser diode 26, a photo diode 27, four contacts 21, 22, 23, 24, a housing 28, and package sealing material 25.

Figure 2:
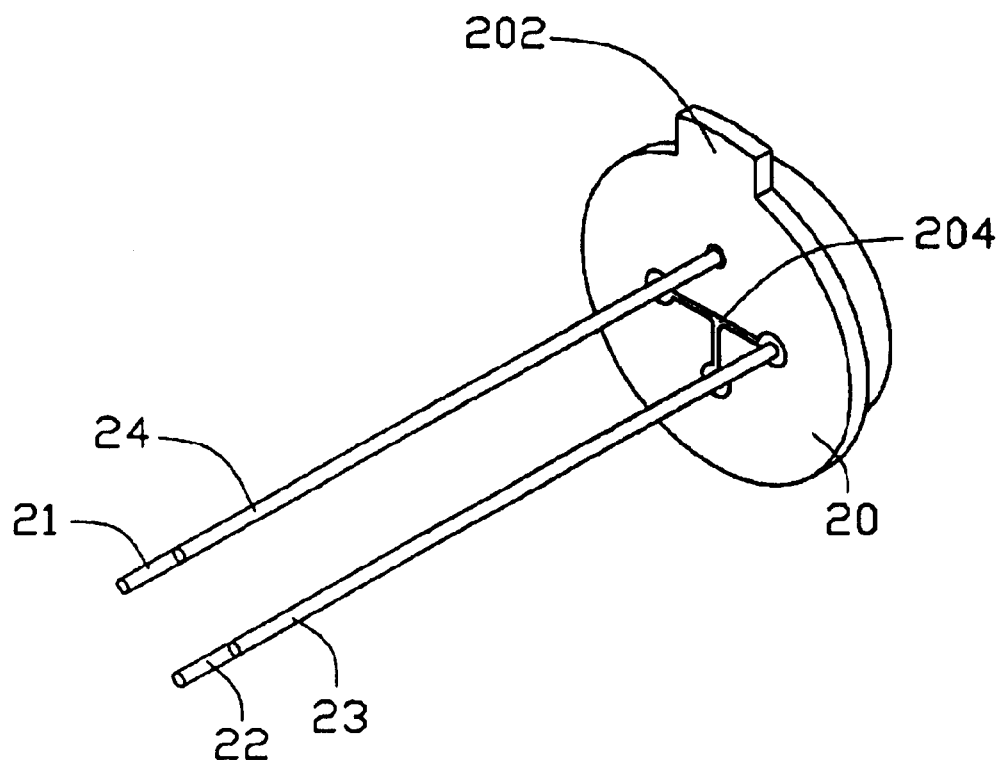
FIG. 2 is a reverse angle view of FIG. 1, partially showing a channel in the base of FIG. 1.

Referring particular to FIGS. 1 and 2, the base 20 is cylindrical in shape, and can be made from a metal material. Three through holes 203 are defined on the bane 20 for the contacts 21, 22 and 23 to pass therethrough. A flange 201 extends outwardly from the side (not labeled) of the base 20, to engage with, a rim (not labeled) of the housing 28 (See FIG. 3). A protrusion 202 extends outwardly from the flange 201 of the bane 20 to distinguish the grounding contact 24 from the contacts 21, 22 and 23. The protrusion 202 also aids in positioning a printed circuit board (PCB).

A T-shaped channel 204 is defined in a center of a bottom of the base 20 in communication with the three through holes 203. Other shapes, such as a triangle, may also be used in place of the T-shape.

The contacts 21, 22, 23 are provided to electrically connect of the laser diode 26 and the photo diode 27 to the PCB. A diameter of the contacts 21, 22, 23 is smaller than a diameter of the through holes 203 in the base 20, to provide a gap 25 therebetween. A top portion of each contacts 21, 22, 23 protrudes above a top surface (not labeled) of the base 20, allowing the laser diode 26 and the photo diode 27 to be connected to the corresponding contacts by conductive wires (not labeled). Generally the laser diode 26 and the photo diode 27 use a grounding contact 24 to connect with the PCB. The contact 24 is soldered to the bottom of the base 20, to make grounding connection with the base 20. It can also be arranged to pass through the base 20.

Package of sealing material 25 is used to seal the LD module and can be of plastic or other dielectric material. The contacts 21, 22, 23 are inserted into the through holes 203, then the melted sealing material 25 can be injected into the channel 204 and the through holes 203 using plastic injection molding technologies. Using this means the contacts 21, 22, 23 are firmly fixed within the base 20, and are electrically insolated from the base 20 and from each, and a seal is formed at the bottom of the base 20.

Figure 4:
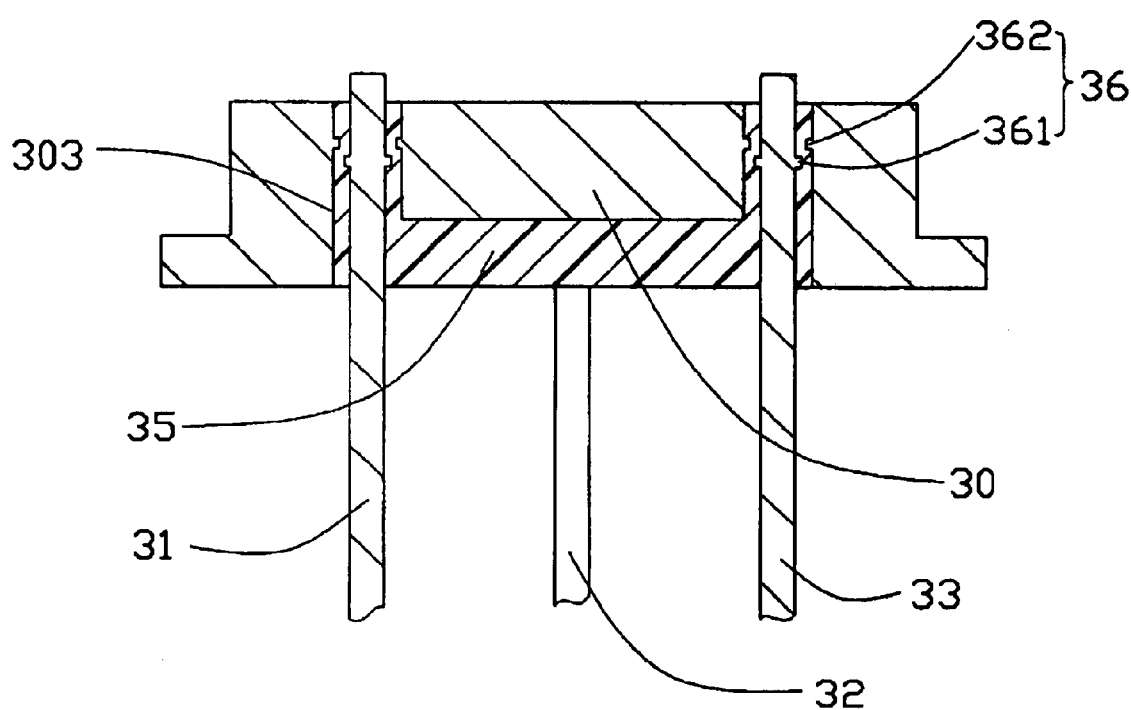
FIG. 4 is a cross-sectional view showing yet another embodiment of the base, the contacts and package sealing material of the present invention.
Figure 5:
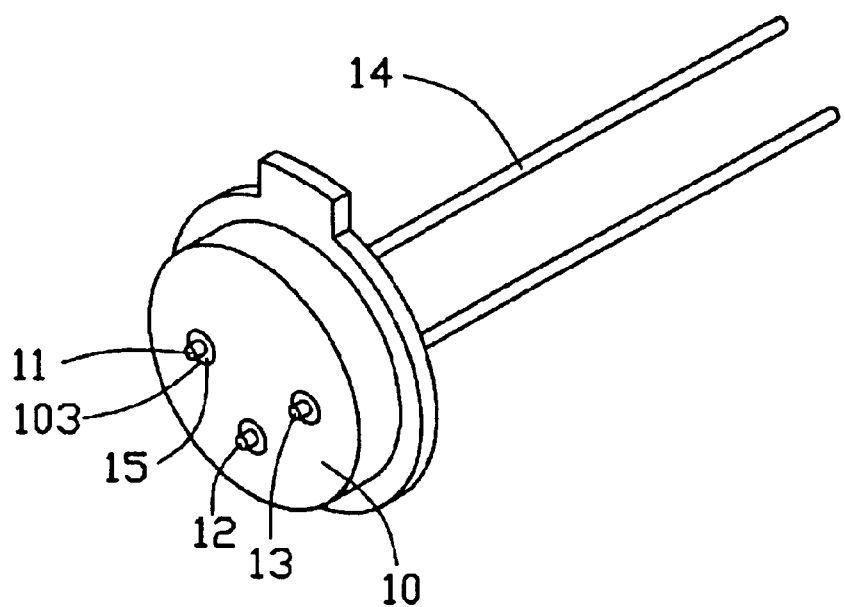
FIG. 5 is a perspective view of a base, contacts, and package sealing material of an LD module of a prior art.
Figure 6:
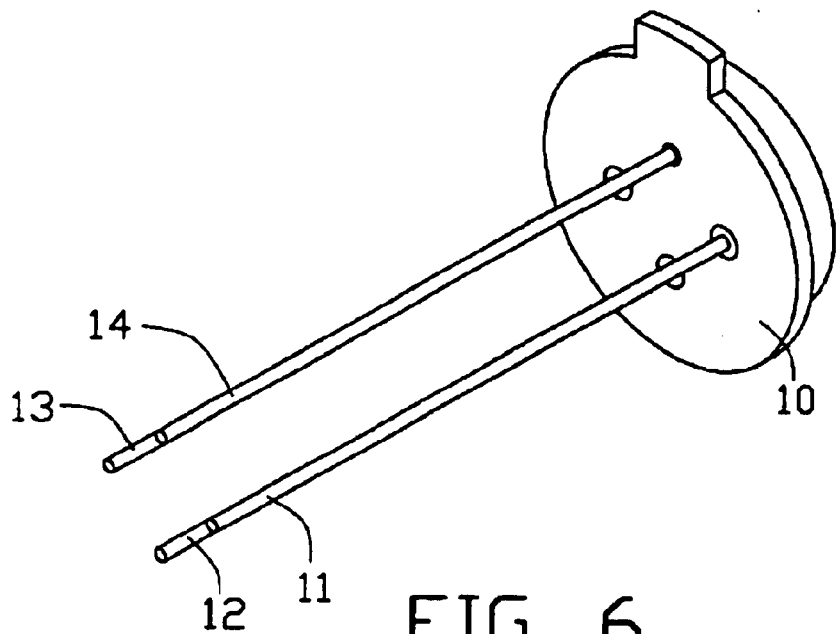
FIG. 6 is a reverse angle view of FIG. 5, partially showing a channel in the base of FIG. 5.
Figure 7B:
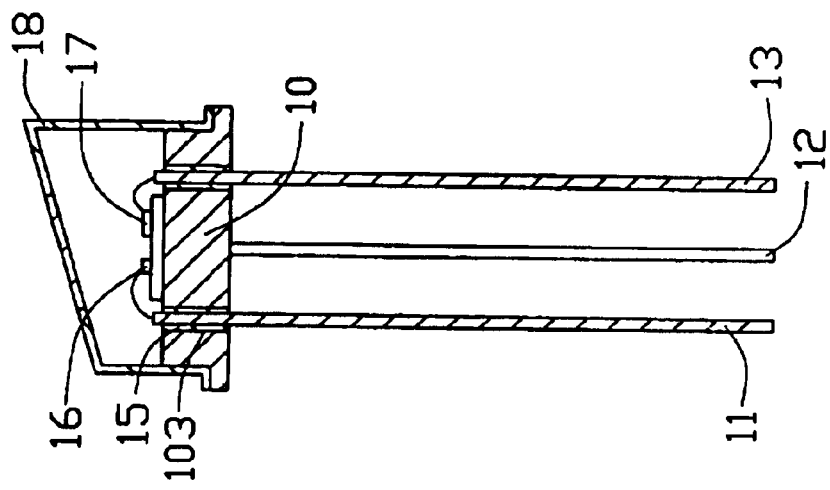
FIG. 7B is a cross-sectional view of a LD module of a prior art.
Figure 7A:
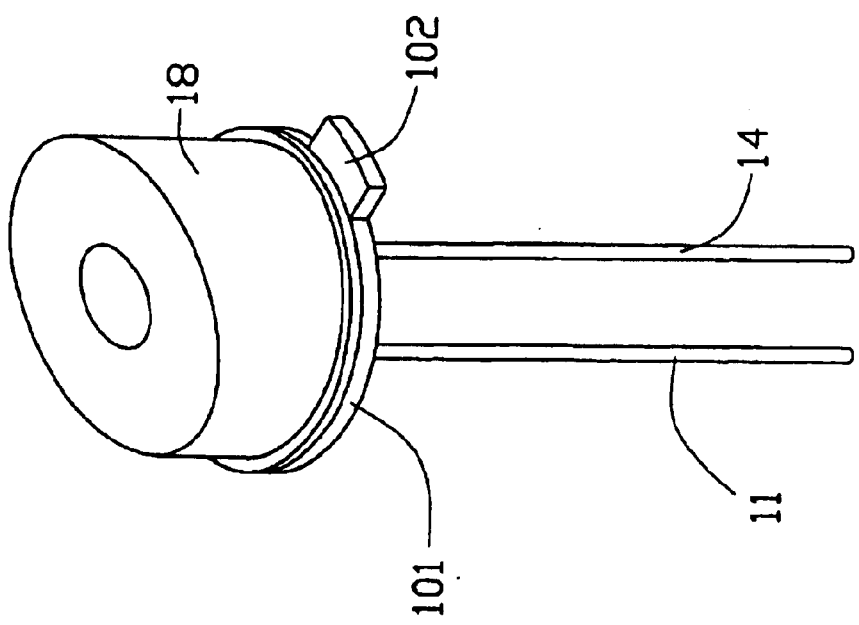
FIG. 7A is a perspective view showing of a LD module of a prior art.

Referring to FIG. 4, a second embodiment according to the present invention is shown, which further includes an interlocking structure 36 between the contacts 31, 32, 33 and a base 30. The interlocking structure 36 comprises a plurality of first tangs 361 defined on each contact 31, 32, 33 and a plurality of second tangs 362 defined on an inner surface (not labeled) of the through hole 303. Position of the first tang 361 and the second tang 362, both being respectively embedded within the package sealing material 35 injected into the through holes 303. This staggered arrangement with the first tang 361 being below, or alternatively above, the second tang 362, strengthens the engagement between the contacts 31, 32, 33 and the base 30. The tangs can be of any minded shapes.

Assembly of the contacts in the LD module according to the present invention does not need lengthy production step on a specified high temperatures production environment. Instead, insert molding techniques are used, which production time and cut production costs.

It should be understood that various changes and modifications to the presently preferred embodiment described herein will be apparent to those skilled in the art. Such changes and modifications may be made without departing from the spirit and scope of the present invention and without diminishing the present invention's advantages. Thus, it is intended that such changes and modifications be covered by the appended claims.

What I claimed is:

1. A package for enclosing a laser diode module suitable for mounting the laser diode module on a printed circuit board (PCB), comprising:
    a base having three through holes and a channel defined in a bottom surface of the base and communicating with the three through holes;
    four contacts for connecting the law diode module with the PCB, three of the contacts being respectively inserted into the three through holes of the base in such position that they are sited within the through hole without electrically contacting, said through holes and the fourth contact making electrical connection with the base; and
    dielectric package sealing material fixing the three contacts in the through holes of the base.

2. The package as described in claim 1, wherein the base is made oft metal material.

3. The package as described in claim 1, wherein a flange extends from the side of the base.

4. The package as described in claim 3, wherein a protrusion extends from the flange of the base to distinguish the grounding contact from the other three contacts.

5. The package as described in claim 4, wherein the protrusion also aids in positioning the laser diode module on the PCB.

6. The package as described in claim 1, wherein the diameter of each contact is smaller than that of the respectively through hole.

7. The package as described in claim 1, wherein the grounding contact is soldered to the bottom surface of the base.

8. The package as described in claim 1, wherein the contacts are made of a conductive material.

9. The package as described in claim 1 wherein each through hole and each corresponding contact further having an interlocking structure on a surface thereof.

10. The package as described in claim 9, wherein the interlocking structure is composed of flanges, notches or both.

11. The package as described in claim 1, wherein the package sealing material is applied into the channel and through holes by means of insert molding.

12. A package adapted to mount a laser diode module on a printed circuit board (PCB), comprising:
    a base having a plurality of through hole, defined therethrough and a channel defined in a surface of the base and communicating with the through holes;
    a plurality of contacts for connection the laser diode module to the print circuit broad, wherein at least one contact makes an electrical connection with the base, and the other contacts are inserted one each into a corresponding through hole with a gap existing between a contact and its corresponding Through hole, and a dielectric packaging material fixing the contact inserted into the through holes in place in the base, wherein the packing material is inserted into the channel and flows into the through holes of the base.

13. The package as described in claim 12, wherein the base is made of a metal material.

14. The package as described in claim 12, wherein a flange extends from the base.

15. The package as described in claim 14, wherein a protrusion extends from the flange of the base to distinguish the contact make electrical connection with th base from the other contacts.

16. The package as described in claim 15, wherein the protrusion also aids in positioning the laser diode module on the PCB.

17. The package as described in claim 12, wherein the diameter of each contact is smaller than a diameter of the corresponding through hole.

18. An optic-electro module comprising:
    a metallic base defining a plurality of through holes therein;
    a housing attached on said base and defining a space therebetween;
    a printed circuit board with at least one diode thereon;
    a plurality of conductive contacts extending through the corresponding through holes, respectively, and at least one of said contacts electrically connecting to the diode, and
    sealing material filled, via an insert molding process, within the through holes and cooperating with retaining structures around the corresponding through holes for not only scaling but also securement thereof;
    wherein said sealing material includes portions linking those in the through holes for wholly forming an integral piece thereof.

* * * * *